United States Patent [19]
Nakayama

[11] Patent Number: 5,847,409
[45] Date of Patent: Dec. 8, 1998

[54] SEMICONDUCTOR DEVICE WITH SUPERLATTICE-STRUCTURED GRADED BUFFER LAYER AND FABRICATION METHOD THEREOF

[75] Inventor: Tatsuo Nakayama, Tokyo, Japan

[73] Assignee: NEC Corporation, Tokyo, Japan

[21] Appl. No.: 651,787

[22] Filed: May 24, 1996

[30] Foreign Application Priority Data

May 26, 1995 [JP] Japan .................................. 7-152300

[51] Int. Cl.$^6$ ............................................. H01L 31/0328

[52] U.S. Cl. ............................. 257/15; 257/20; 257/185; 257/190; 257/191; 257/192; 257/200; 257/205

[58] Field of Search ................................ 257/15, 20, 185, 257/190–194, 196, 200, 205, 207

[56] References Cited

U.S. PATENT DOCUMENTS

| 4,994,868 | 2/1991 | Geissberger et al. | 257/282 |
| 5,621,228 | 4/1997 | Ando | 257/192 |
| 5,633,516 | 5/1997 | Mishima et al. | 257/200 |
| 5,650,642 | 7/1997 | Sawada et al. | 257/194 |

FOREIGN PATENT DOCUMENTS

| 363197379 | 8/1988 | Japan | 257/20 |
| 403055851 | 3/1991 | Japan | 257/20 |

OTHER PUBLICATIONS

Mobilities of a two–dimensional electron gas in pseudomorphic and strain–free InAlAs/InGaAs HEMT Structures, Matsuno et al., Int'l Symposium GaAs and Related Commpounds, 1992, pp. 729–734.

Primary Examiner—Tom Thomas
Assistant Examiner—Fetsum Abraham
Attorney, Agent, or Firm—Whitham, Curtis & Whitham

[57] ABSTRACT

A semiconductor device that enables to prevent the electron transport property of a semiconductor active layer from degrading even if a semiconductor compositionally-graded buffer layer is used. This device contains a semiconductor substrate, a semiconductor active layer lattice-mismatched with the substrate, and a semiconductor compositionally-graded buffer layer formed between the substrate and the active layer. The compositionally-graded buffer layer has a semiconductor superlattice structure including first semiconductor sublayers and second semiconductor sublayers that are alternately stacked in a direction perpendicular to the substrate. Each of the first sublayers is made of a first semiconductor material. Each of the second sublayers is made of a second semiconductor material different in composition from the first semiconductor material. The lattice constant of the first and second sublayers decreases or increases stepwise from a side near the substrate and the other side near the active layer. The lattice constant of any one of the second sublayers may be larger than that of an adjacent one of the first sublayers and is smaller than that of another adjacent one of the first sublayers.

7 Claims, 6 Drawing Sheets

FIG. 1
PRIOR ART

| | |
|---|---|
| n-$In_yAl_{1-y}As$   DONOR | 307 |
| $In_yAl_{1-y}As$   SPACER | 306 |
| $In_xGa_{1-x}As$   CHANNEL | 305 |
| $In_yAl_{1-y}As$   BUFFER | 304 |
| $In_yAl_{1-y}As$   GRADED BUFFER | 303 |
| $In_yAl_{1-y}As$   BUFFER | 302 |
| InP SUBSTRATE | 301 |

SEMICONDUCTOR DEVICE WITH SUPERLATTICE-STRUCTURED GRADED BUFFER LAYER AND FABRICATION METHOD THEREOF

BACKGROUND OF THE INVENTION

1. Field of the Invention

The present invention relates to a semiconductor device and a fabrication method thereof and more particularly, to a semiconductor device with a superlattice-structured graded buffer layer placed between a semiconductor substrate and a semiconductor active layer lattice-mismatched with the substrate, and a fabrication method of the device.

2. Description of the Prior Art

With conventional compound-semiconductor field-effect transistors (FETs) having a semiconductor active layer whose lattice constant is different from that of a semiconductor substrate, a strained semiconductor layer has been used as the active layer. However, because the active layer has a thickness limited by the critical layer thickness and is subjected to the effect of a strain, the electron transport property of the conventional FETs have been inferior to that expected in the case where a strain-free semiconductor layer is used as the active layer.

To solve the problem relating to the electron transport property, an improved device structure has been developed in which a semiconductor buffer layer having a graded composition is placed between the substrate and the active layer to thereby relax the strain contained in the active layer. This buffer layer has a structure whose composition (i.e., lattice constant) varies gradually from the lattice constant value of the substrate to that of the active layer. This buffer layer has been termed the "compositionally-graded buffer layer".

An example of the conventional FETs of this sort is shown in FIG. 1, which was disclosed, for example, by Matsuno et al., in a paper, International Symposium GaAs and Related Compounds, Karuizawa, 1992, pp 729–734, entitled "Mobilities of a two-dimensional electron gas in pseudo-morphic and strain-free InAlAs/InGaAs HEMT structures".

In the conventional strain-free FET shown in FIG. 1, an $In_yAl_{1-y}As$ buffer layer 302 is formed on a semi-insulating InP substrate 301, where the In mole fraction y is 0.52.

An $In_yAl_{1-y}As$ compositionally-graded buffer layer 303 is formed on the underlying $In_{0.52}Al_{0.48}As$ buffer layer 302, where the In mole fraction y of the layer 303 varies from 0.52 to 0.7. An $In_yAl_{1-y}As$ buffer layer 304 is formed on the underlying $In_yAl_{1-y}As$ graded buffer layer 303, where the In mole fraction y of the layer 304 is 0.7.

An $In_xGa_{1-x}As$ channel layer 305 is formed on the underlying $In_{0.7}Al_{0.3}As$ buffer layer 304, where the In mole fraction x of the layer 305 is 0.8. An $In_yAl_{1-y}As$ spacer layer 306 is formed on the underlying $In_{0.8}Ga_{0.2}As$ channel layer 305, where the In mole fraction y of the layer 306 is 0.7.

An n-$In_yAl_{1-y}As$ donor layer 307, which is doped with an n-type impurity, is formed on the underlying $In_{0.7}Al_{0.3}As$ spacer layer 306, where the In mole fraction y of the layer 307 is 0.7.

Each of the films 302, 303, 304, 305, 306 and 307 is grown, for example, by using the Molecular Beam Epitaxy (MBE) technique.

With the conventional FET of FIG. 1, since the $In_{0.52}Al_{0.48}As$ graded buffer layer 303 in which the In mole fraction y is changed from 0.52 lattice-matched to the underlying buffer layer 302 to 0.7 lattice-matched to the overlying $In_{0.7}Al_{0.3}As$ buffer layer 304, the strain contained in the $In_{0.8}Ga_{0.2}As$ channel layer 305 greatly decreases in amount. This strain reduction causes the reduction of the effective mass of an electron parallel to the surface of the substrate 301, thereby improving the electron transport property of this FET.

However, with the above conventional FET of FIG. 1, it is required that the three $In_yAl_{1-y}As$ buffer layers 302, 305 and 304 are as thick as approximately 1 μm in total. In other words, the two $In_yAl_{1-y}As$ buffer layers 302 and 303 are necessary to be as thick as approximately 0.8 μm in total. Consequently, a problem that the total formation or growth time for these buffer layers 302, 303 and 304 is long occurs.

Further, the compositionally-graded buffer layer 303 usually contains a large number of dislocations and crystal or lattice defects. These dislocations and crystal defects tend to propagate upward toward the top of this FET, thereby degrading the crystalline quality of the channel layer 305. Thus, another problem that the improvement in electron transfer property due to the existence of the graded buffer layer 302 tends to be prevented takes place.

SUMMARY OF THE INVENTION

Accordingly, an object of the present invention is to provide a semiconductor device and a fabrication method thereof in which the electron transport property of a semiconductor active layer can be prevented from degrading due to the use of a semiconductor compositionally-graded buffer layer.

Another object of the present invention is to provide a semiconductor device and a fabrication method thereof in which the above degradation preventing effect in the electron transport property can be obtained even when the compositionally-graded buffer layer is less in thickness than that of the conventional semiconductor device of FIG. 1.

Still another object of the present invention is to provide a semiconductor device and a fabrication method thereof that enables to decrease the necessary formation time of the compositionally-graded buffer layer.

The above objects together with others not specifically mentioned will become clear to those skilled in the art from the following description.

According to a first aspect of the present invention, a semiconductor device is provided. This device contains a semiconductor substrate, a semiconductor active layer lattice-mismatched with the substrate, and a semiconductor compositionally-graded buffer layer formed between the substrate and the active layer.

The compositionally-graded buffer layer has a semiconductor superlattice structure including first semiconductor sublayers and second semiconductor sublayers that are alternately stacked in a direction perpendicular to the substrate. Each of the first sublayers is made of a first semiconductor material. Each of the second sublayers is made of a second semiconductor material different from the first semiconductor material. The lattice constant of the first and second sublayers varies (i.e., decreases or increases) stepwise from a side near the substrate and the other side near the active layer.

With the semiconductor device according to the first aspect of the present invention, since the compositionally-graded buffer layer has the semiconductor superlattice structure including the first and second sublayers made of the different semiconductor materials, heterojunctions are produced at the interface of any adjacent two ones of the first and second sublayers. Therefore, dislocations generated in the compositionally-graded buffer layer can be released in a direction parallel to the respective interfaces of the first and second sublayers.

Also, the propagation of lattice defects generated in the compositionally-graded buffer layer to the active layer can be restrained.

As a result, the effects of the dislocations and the lattice defects to the active layer can be reduced, thereby preventing the crystalline quality of the active layer from degrading even if the semiconductor compositionally-graded buffer layer is used.

In addition, because the propagation of the dislocations and the lattice defects in the compositionally-graded buffer layer to the active layer is restrained, the thickness of the compositionally-graded buffer layer itself can be reduced. For example, the compositionally-graded buffer layer may be as thick as 200 nm or less.

Further, since the thickness of the compositionally-graded buffer layer can be reduced, the formation or growth time required for this buffer layer can be shortened.

According to a second aspect of the present invention, another semiconductor device is provided. This device contains a semiconductor substrate, a semiconductor active layer lattice-mismatched with the substrate, and a semiconductor compositionally-graded buffer layer formed between the substrate and the active layer.

The compositionally-graded buffer layer has a superlattice structure including first semiconductor sublayers and second semiconductor sublayers that are alternately stacked in a direction perpendicular to the substrate. Each of the first sublayers is made of a semiconductor material. Each of the second sublayers is made of the same semiconductor material as that of the first sublayers. The lattice constant of any one of the second sublayers is larger than that of an adjacent one of the first sublayers and is smaller than that of another adjacent one of the first sublayers.

With the semiconductor device according to the second aspect of the present invention, because of the same reason as shown in the semiconductor device according to the first aspect, the crystalline quality of the active layer can be prevented from degrading even if the semiconductor compositionally-graded buffer layer is used. Further, the thickness of the compositionally-graded buffer layer itself can be reduced and therefore, the formation or growth time required for this buffer layer can be shortened.

In addition, since the lattice constant of any one of the second sublayers is larger than that of an adjacent one of the first sublayers and is smaller than that of another adjacent one of the first sublayers, the comprehensive and tensile strains are generated at the respective interfaces of the concerned second sublayer with the adjacent two ones of the first sublayers. Thus, the releasing effect of the dislocations in the first and second sublayers are greater than that of the device according to the first aspect. Accordingly, the effects of the dislocations and the crystal defects on the active layer can be further restrained.

In a preferred embodiment of the semiconductor device according to the second aspect, the average lattice constant of any one of the first sublayers and an adjacent one of the second sublayers varies stepwise from a lattice constant of the substrate to that of the active layer.

The "average lattice constant" is defined as a half of the sum of the lattice constant values of any one of the first sublayers and an adjacent one of the second sublayers."

In another preferred embodiment of the semiconductor device according to the second aspect, the first and second sublayers are made of a single compound semiconductor, and the constituent element ratio of the first sublayers are different from that of the second sublayers.

According to a third aspect of the present invention, a fabrication method of a semiconductor device is provided. This method includes a step of forming a semiconductor compositionally-graded buffer layer on or over a semiconductor substrate, and a step of forming an active layer on or over the compositionally-graded buffer layer.

During the step of forming the compositionally-graded buffer layer, first semiconductor sublayers and second semiconductor sublayers are alternately formed to be stacked on or over the substrate in a direction perpendicular to the substrate, thereby forming a semiconductor superlattice structure. Each of the first sublayers is made of a first semiconductor material. Each or the second sublayers is made of a second semiconductor material different from the first semiconductor material. Each of the first and second sublayers is formed so that a lattice constant of each of the first and second sublayers varies stepwise from a side near the substrate and the other side near the active layer.

With the fabrication method according to the third aspect of the invention, the semiconductor device according to the first aspect can be obtained.

According to a fourth aspect of the present invention, another fabrication method of a semiconductor device is provided. This method includes a step of forming a semiconductor compositionally-graded buffer layer on or over a semiconductor substrate, and a step of forming an active layer on or over the compositionally-graded buffer layer.

During the step or forming the compositionally-graded buffer layer, first semiconductor sublayers and second semiconductor sublayers are alternately formed to be stacked on or over the substrate in a direction perpendicular to the substrate, thereby forming a semiconductor superlattice structure. Each of the first sublayers is made of a semiconductor material. Each of the second sublayers is made of the same semiconductor material as that of the first sublayers. The lattice constant of any one of the second sublayers is larger than that of an adjacent one of the first sublayers and is smaller than that of another adjacent one of the first sublayers.

With the fabrication method according to the fourth aspect of the invention, the semiconductor device according to the second aspect can be obtained.

In the semiconductor devices according to the first and second aspects and the fabrication methods according to the third and fourth aspects, the compositionally-graded buffer layer may be directly formed on the substrate. Any semiconductor layer may be additionally formed between the substrate and the compositionally-graded buffer layer, resulting in the compositionally-graded buffer layer indirectly formed on the substrate through the additionally formed semiconductor layer.

Similarly, the active layer may be directly formed on the compositionally-graded buffer layer. Any semiconductor layer may be additionally formed between the active layer and the compositionally-graded buffer layer, resulting in the active layer indirectly formed on the compositionally-graded buffer layer through the additionally formed semiconductor layer.

BRIEF DESCRIPTION OF THE DRAWINGS

In order that the invention may be readily carried into effect, it will now be described with reference to the accompanying drawings.

FIG. 1 is a schematic, partial cross-sectional view of a conventional semiconductor device.

DETAILED DESCRIPTION OF THE PREFERRED EMBODIMENTS

Preferred embodiments of the present invention will be described in detail below while referring to FIG. 2, FIGS. 3A to 3G, FIG. 4 and FIGS. 5A to 5E attached.

FIRST EMBODIMENT

Figure 2:
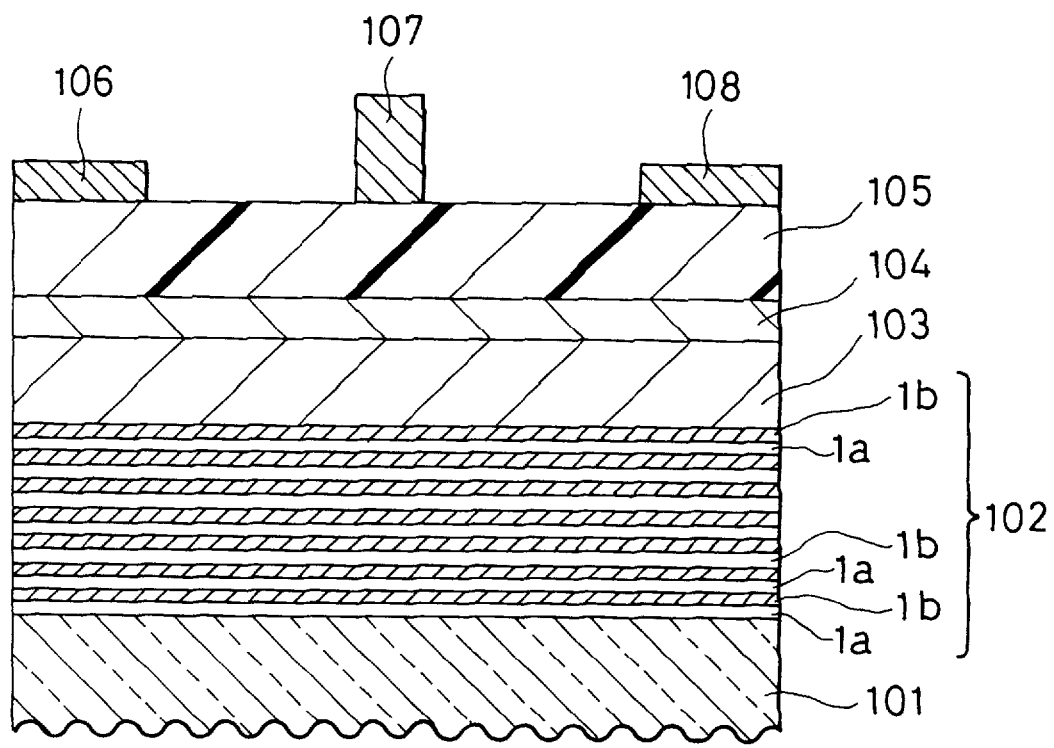
FIG. 2 is a schematic, partial cross-sectional view of a semiconductor device according to a first embodiment of the invention.

A semiconductor device according to a first embodiment of the present invention is shown in FIG. 2. This device constitutes a compound-semiconductor FET.

In FIG. 2, an InAlAs/InGaAs compositionally-graded buffer layer 102 having a superlattice structure is directly formed on a semi-insulating InP substrate 101 with the (100) crystal plane.

The superlattice structure of the compositionally-graded buffer layer 102 is made of seven $In_xAl_{1-x}As$ sublayers 1a each having a thickness of 10 nm and seven $In_xGa_{1-x}As$ sublayers 1b each having a thickness of 10 nm. These sublayers 1a and 1b are alternately stacked in a direction perpendicular to the substrate 101. Since the number of the sublayers 1a and 1b is 14, the total thickness of the layer 102 is 140 nm.

An $In_{0.8}Ga_{0.2}As$ channel layer 103 as a semiconductor active layer 103 is formed on the underlying InAlAs/InGaAs compositionally-graded buffer layer 102. An $In_{0.52}Al_{0.48}As$ spacer layer 104 is formed on the underlying $In_{0.8}Ga_{0.2}As$ channel layer 103. An n-type $In_{0.52}Al_{0.48}As$ donor layer 105 as a semiconductor carrier-supplying layer is formed on the underlying $In_{0.52}Al_{0.48}As$ spacer layer 104. The donor layer 105 is doped with silicon (Si) as an n-type dopant at a concentration of $2 \times 10^{18}$ atoms/cm$^2$.

Source, drain and gate electrodes 106, 107 and 108 are formed at intervals on the donor layer 105.

It can be said that the superlattice structure of the compositionally-graded buffer layer 102 is made of first to seventh pairs of the InAlAs/InGaAs sublayers 1a and 1b. Any one pair of the sublayers 1a and 1b has a different InAs composition x from any other pair of the sublayers 1a and 1b, where x is 0.52, 0.55, 0.60, 0.65, 0.70, 0.75 and 0.80. The pair of the sublayers 1a and 1b positioned nearest to the substrate 101 has an InAs composition x of 0.52, and the pair of the sublayers 1a and 1b positioned farthest from the substrate 101 has an InAs composition x of 0.80. The other pairs of the sublayers 1a and 1b have an InAs composition x whose value increases stepwise from 0.55 to 0.75.

Specifically, the fourteen sublayers 1a and 1b are positioned in first to fourteenth levels, respectively. The $In_xAl_{1-x}As$ sublayer 1a located in the first level and the $In_xGa_{1-x}As$ sublayer 1b in the second level has the same InAs composition x or 0.52. In other words, the first-level sublayer 1a has a composition of $In_{0.52}Al_{0.48}As$ and the second-level sublayer 1b has a composition of $In_{0.52}Ga_{0.48}As$.

The $In_xAl_{1-x}As$ sublayer 1a located in the third level and the $In_xGa_{1-x}As$ sublayer 1b in the fourth level has the same InAs composition x of 0.55. In other words, the third-level sublayer 1a has a composition of $In_{0.55}Al_{0.45}As$ and the fourth-level sublayer 1b has a composition of $In_{0.55}Ga_{0.45}As$.

The $In_xAl_{1-x}As$ sublayer 1a located in the fifth level and the $In_xGa_{1-x}As$ sublayer 1b in the sixth level has the same InAs composition x of 0.60. In other words, the fifth-level sublayer 1a has a composition of $In_{0.6}Al_{0.4}As$ and the sixth-level sublayer 1b has a composition of $In_{0.6}Ga_{0.4}As$.

The $In_xAl_{1-x}As$ sublayer 1a located in the seventh level and the $In_xGa_{1-x}As$ sublayer 1b in the eighth level has the same InAs composition x of 0.65. In other words, the seventh-level sublayer 1a has a composition of $In_{0.65}Al_{0.35}As$ and the eighth-level sublayer 1b has a composition of $In_{0.65}Ga_{0.35}As$.

The $In_xAl_{1-x}As$ sublayer 1a located in the ninth level and the $In_xGa_{1-x}As$ sublayer 1b in the tenth level has the same InAs composition x of 0.70. In other words, the ninth-level sublayer 1a has a composition of $In_{0.7}Al_{0.3}As$ and the tenth-level sublayer 1b has a composition of $In_{0.7}Ga_{0.3}As$.

The $In_xAl_{1-x}As$ sublayer 1a located in the eleventh level and the $In_xGa_{1-x}As$ sublayer 1b in the twelfth level has the same InAs composition x of 0.75. In other words, the eleventh-level sublayer 1a has a composition of $In_{0.75}Al_{0.25}As$ and the twelfth-level sublayer 1b has a composition of $In_{0.75}Ga_{0.25}As$.

The $In_xAl_{1-x}As$ sublayer 1a located in the thirteenth level and the $In_xGa_{1-x}As$ sublayer 1b in the fourteenth level has the same InAs composition x of 0.80. In other words, the thirteenth-level sublayer 1a has a composition of $In_{0.8}Al_{0.2}As$ and the fourteenth-level sublayer 1b has a composition of $In_{0.8}Ga_{0.2}As$.

Generally, the lattice constant of a crystal layer increases or decreases proportional to the value of the composition. Therefore, the first to seventh pairs of the InAlAs/InGaAs sublayers 1a and 1b have a lattice constant whose value increases stepwise proportional to the values of 0.52, 0.55, 0.60, 0.65, 0.70, 0.75 and 0.80 of the InAs composition x.

With the semiconductor device according to the first embodiment, since the compositionally-graded buffer layer 102 has the semiconductor superlattice structure including the composition-different sublayers 1a and 1b, heterojunctions are produced at the interface of any adjacent two of the sublayers 1a and 1b. Therefore, dislocations generated in the compositionally-graded buffer layer 102 can be released in a direction parallel to the respective interfaces of the sublayers 1a and 1b.

Also, the propagation of lattice defects generated in the graded buffer layer 102 to the channel layer 103 can be restrained.

As a result, the effects of the dislocations and the lattice defects to the channel layer 103 can be reduced, thereby preventing the crystalline quality of the layer 103 from degrading even if the compositionally-graded buffer layer 102 is used. This leads to the performance improvement of this FET.

In addition, because the propagation of the dislocations and the lattice defects in the compositionally-graded buffer layer 102 to the channel layer 103 is restrained, the thickness of the buffer layer 103 itself can be reduced to 14 nm.

Further, since the thickness of the compositionally-graded buffer layer 102 can be reduced, the formation or growth time required for this layer 102 can be shortened.

Figure 3A:
FIGS. 3A to 3G are schematic, partial cross-sectional views of the semiconductor device according to the first embodiment, which shows a fabrication process steps of this device, respectively.
Figure 3B:
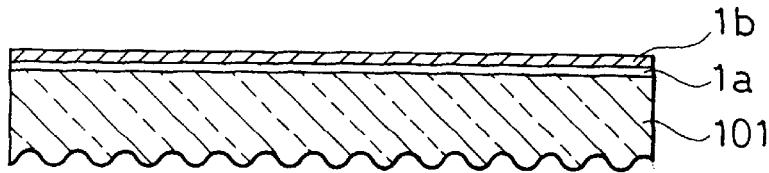

The above semiconductor device according to the first embodiment is fabricated by the following process steps using a popular MBE technique:

First, as shown in FIG. 3A, the first-level $In_{0.52}Al_{0.48}As$ sublayer 1a is grown on the InP substrate 101. Next, the second-level $In_{0.52}Ga_{0.48}As$ sublayer 1b is grown on the first-level $In_{0.52}Al_{0.48}As$ sublayer 1a, as shown in FIG. 3B.

Figure 3C:
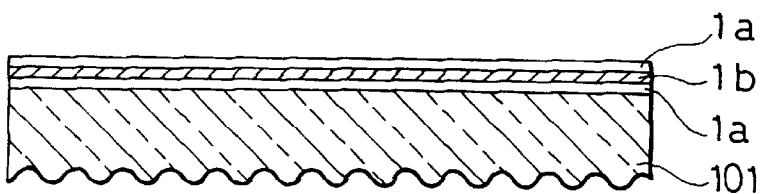
Figure 3D:
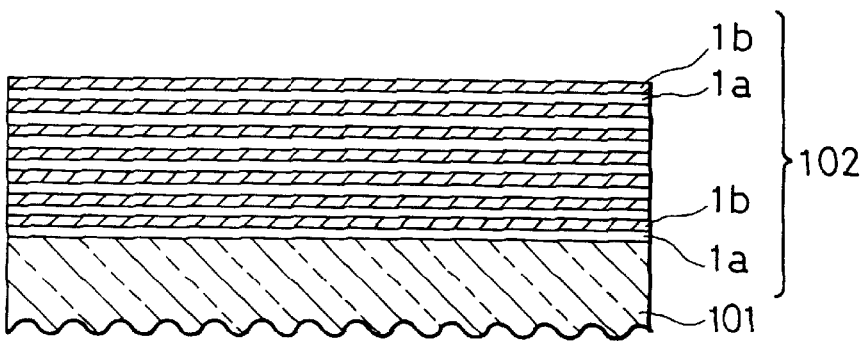

The same process steps as those for the first- and second-level sublayers 1a and 1b are repeated seven times in total while the In composition x is changed in the same manner as stated above, thereby forming the InAlAs/InG&As compositionally-graded buffer layer 102 having the superlattice structure on the substrate 101, as shown in FIGS. 3C and 3D.

Figure 3E:
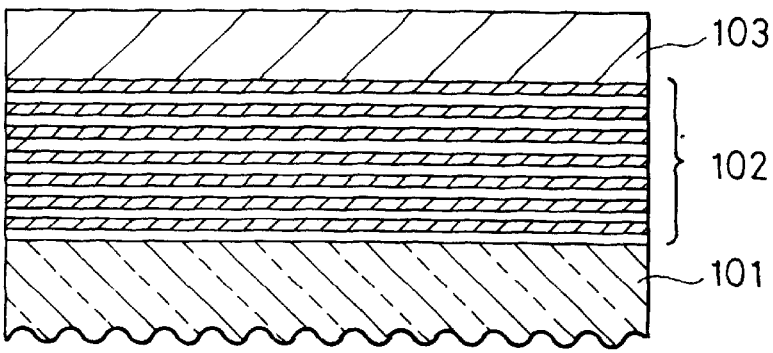
Figure 3F:
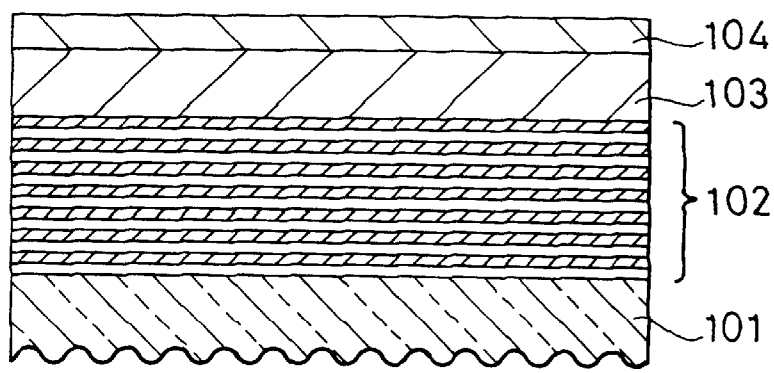
Figure 3G:
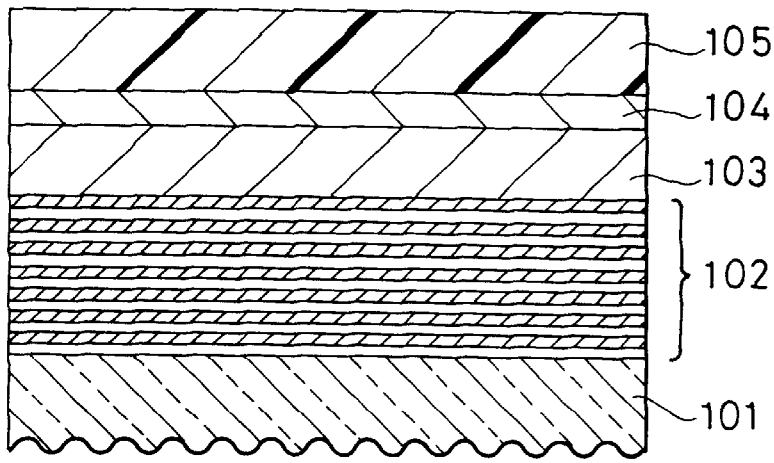

Further, the $In_{0.8}Ga_{0.2}As$ channel layer 103 is grown on the underlying InAlAs/InGaAs compositionally-graded buffer layer 102, as shown in FIG. 3E. The $In_{0.52}Al_{0.48}As$ spacer layer 104 and the n-type $In_{0.52}Al_{0.48}As$ donor layer 105 are successively grown on the underlying buffer layer 103, as shown in FIGS. 3F and 3G.

Finally, the source, drain and gate electrodes 106, 107 and 108 are formed at intervals on the donor layer 105 using popular metallizing and patterning techniques. Thus, the semiconductor device according to the first embodiment as shown in FIG. 2 is finished.

In the device according to the first embodiment, InP substrate 101 and the $In_{0.8}Ga_{0.2}As$ channel layer 103 are used, and therefore, the InAlAs/InGaAs compositionally-graded buffer layer 102 with the superlattice structure is used. However, the substrate may be any other semiconductor substrate than an InP substrate, such as GaAs and Si. The channel or active layer may be made of a substance made of a compound semiconductor or semiconductors, such as InAs, InP, InSb, GaAs, GaP, and GaSb, or a IV-group semiconductor, such as Si and Ge.

Likewise, the compositionally-graded buffer layer 102 may be composed of more than one type of different semiconductor layers providing a lattice constant between the lattice constant value of the substrate and that of the active layer. The sublayers constituting the superlattice structure may have an arbitrary or desired thickness.

SECOND EMBODIMENT

Figure 4:
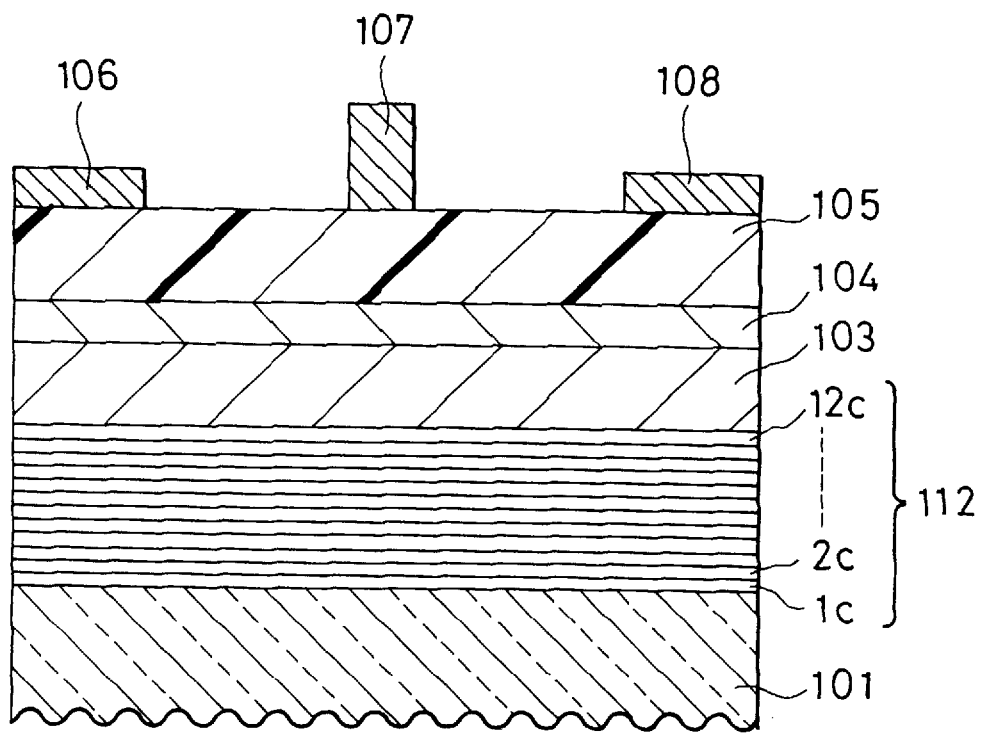
FIG. 4 is a schematic, partial cross-sectional view of a semiconductor device according to a second embodiment of the invention.

A semiconductor device according to a second embodiment or the present invention is shown in FIG. 4. This device also constitutes a compound-semiconductor FET.

The semiconductor device according to the second embodiment is the same in configuration as that of the first embodiment except that an InAlAs compositionally-graded buffer layer 112 is used instead of the InAlAs/InGaAs compositionally-graded buffer layer 102. Therefore, the description relating to the same configuration is omitted here for the sake of simplification of description by adding the same reference numerals as those in the first embodiment to the corresponding elements or members.

Unlike the first embodiment, the superlattice structure of the compositionally-graded buffer layer 112 is made of only twelve $In_xAl_{1-x}As$ sublayers 1c to 12c each having a thickness of 10 nm. These sublayers 1c to 12c are successively stacked in a direction perpendicular to the substrate 101.

Since the superlattice structure is made of the twelve sublayers 1c to 12c, the total thickness of the layer 112 is 120 nm.

The first- to twelfth-level sublayers 1c to 12c have an InAs composition x of 0.52, 0.60, 0.55, 0.65, 0.60, 0.70, 0,65, 0.75, 0.70, 0.80, 0.75, and 0.85.

Specifically, the first-level sublayer 1c has a composition of $In_{0.52}Al_{0.48}As$. The second-level sublayer 2c has a composition of $In_{0.6}Ga_{0.4}As$. The third-level sublayer 3c has a composition of $In_{0.55}Ga_{0.45}As$. The fourth-level sublayer 4c has a composition of $In_{0.65}Ga_{0.35}As$. The fifth-level sublayer 5c has a composition of $In_{0.6}Ga_{0.4}As$. The sixth-level sublayer 6c has a composition of $In_{0.7}Ga_{0.3}As$. The seventh-level sublayer 7c has a composition of $In_{0.65}Ga_{0.35}As$. The eighth-level sublayer 8c has a composition of $In_{0.75}Ga_{0.25}As$. The ninth-level sublayer 9c has a composition of $In_{0.7}Ga_{0.3}As$. The tenth-level sublayer 10c has a composition of $In_{0.8}Ga_{0.2}As$. The eleventh-level sublayer 11c has a composition of $In_{0.75}Ga_{0.25}As$. The twelfth-level sublayer 12c has a composition of $In_{0.85}Ga_{0.15}As$.

Therefore, the first- to twelfth-level InAlAs sublayers 1c to 12c have a lattice constant whose value increases proportional to the values of 0.52, 0.60, 0.55, 0.65, 0.60, 0.70, 0.65, 0.75, 0.70, 0.60, 0.75 and 0.85 of the InAs mole fraction x.

The average lattice constant of the adjacent two ones of the sublayers 1c to 12c are 0.56, 0.575, 0.6, 0.625, 0.65, 0.675, 0.7, 0,725, 0.75, 0.775 and 0.8, respectively. Thus, the average lattice constant of these sublayers increases stepwise from 0.56 to 0.8.

With the semiconductor device according to the second embodiment, because of the same reason as shown in the semiconductor device according to the first embodiment, the crystalline quality of the channel layer 103 can be prevented from degrading even if the semiconductor compositionally-graded buffer layer 112 is used. Further, the thickness of the compositionally-graded buffer layer 112 itself can be reduced to 120 nm and therefore, the formation or growth time required for this buffer layer 112 can be shortened.

In addition, since the lattice constant of the second-level sublayer 2c is larger than that of the first-level sublayer 1c and is larger than that of the third-level sublayer 3c. Further, the lattice constant of the third-level sublayer 3c is larger than that of the first-level sublayer 1c and is smaller than that of the second-level sublayer 2c.

The same relationship as that for the combination of the first, second and third-level sublayers 1c, 2c and 3c is applied for the combination of the third-, fourth- and fifth-level sublayers 3c, 4c and 5c, the combination of the fifth-, sixth- and seventh-level sublayers 5c, 6c and 7c, the combination of the seventh-, eighth- and ninth-level sublayers 7c, 8c and 9c, and the combination of the ninth-, tenth- and eleventh-level sublayers 9c, 10c and 11c.

Thus, the releasing effect of the dislocations in the sublayers 1c to 12c are greater than that of the device according to the first embodiment. Accordingly, the effects of the dislocations and the crystal defects on the channel layer 103 can be further restrained.

Figure 5A:
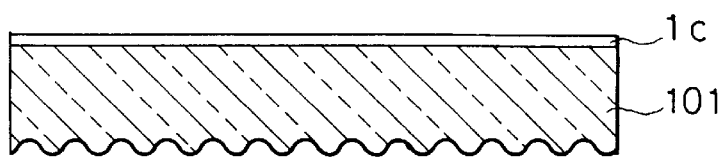
FIGS. 5A to 5E are schematic, partial cross-sectional views of the semiconductor device according to the second embodiment, which shows a fabrication process steps of this device, respectively.
Figure 5B:
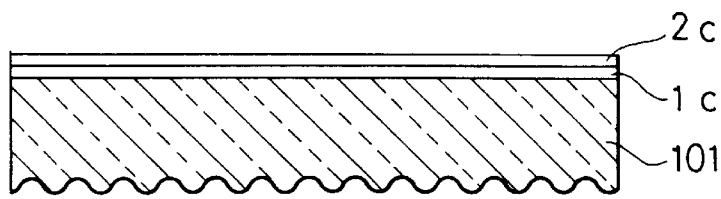

The above semiconductor device according to the second embodiment is fabricated by the following process steps using a popular MBE technique:

First, as shown in FIG. 5A, the first-level $In_{0.52}Al_{0.48}As$ sublayer 1c is grown on the InP substrate 101. Next, the second-level $In_{0.6}Al_{0.4}As$ sublayer 2c is grown on the first-level $In_{0.52}Al_{0.48}As$ sublayer 1c, as shown in FIG. 5B.

Figure 5C:
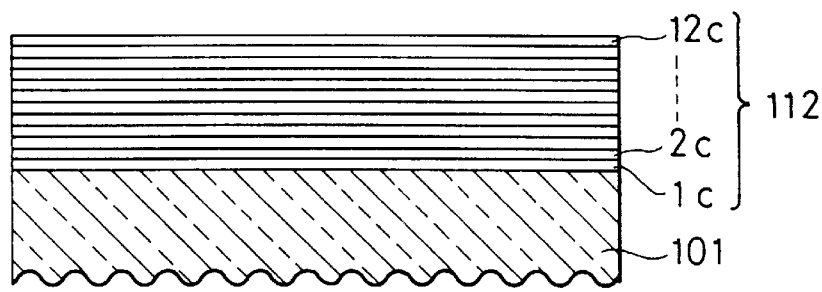

The same process steps as that for the first-level sublayer 1c is repeated twelve times in total while the InAs composition x is changed in the same manner as stated above, thereby forming the InAlAs compositionally-graded buffer layer 112 having the superlattice structure on the substrate 101, as shown in FIG. 5C.

Figure 5D:
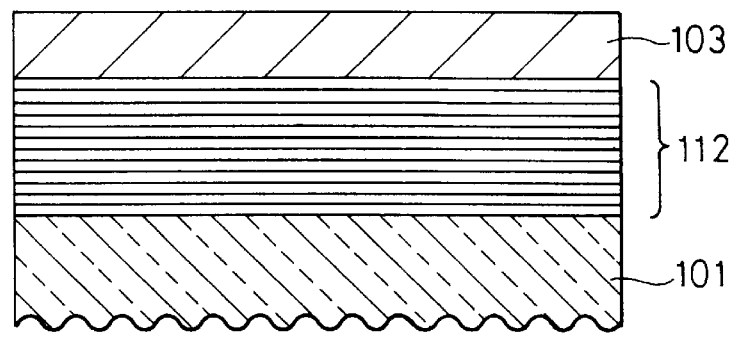
Figure 5E:
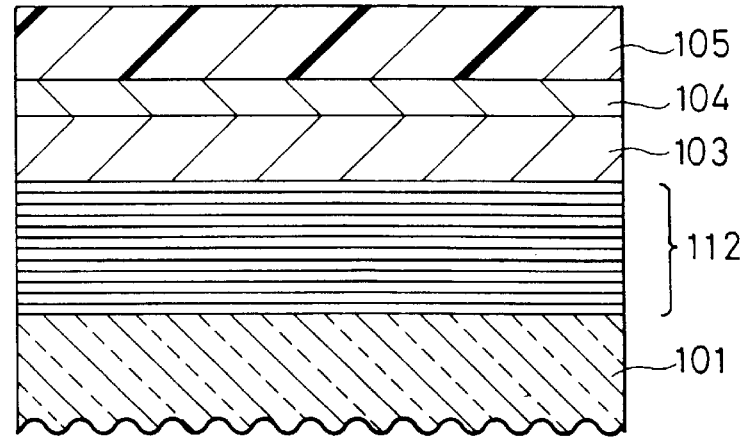

Further, the $In_{0.8}Ga_{0.2}As$ channel layer 103 is grown on the underlying InAlAs compositionally-graded buffer layer 112, as shown in FIG. 5D. The $In_{0.52}Al_{0.48}As$ spacer layer 104 and the n-type $In_{0.52}Al_{0.48}As$ donor layer 105 are successively grown on the underlying channel layer 103, as shown in FIG. 5E.

Finally, the source, drain and gate electrodes 106, 107 and 108 are formed at intervals on the donor layer 105 using popular metallizing and patterning techniques. Thus, the semiconductor device according to the second embodiment as shown in FIG. 4 is finished.

In the device according to the second embodiment, InP substrate 101 and the $In_{0.8}Ga_{0.2}As$ channel layer 103 are used, and therefore, the InAlAs compositionally-graded buffer layer 112 with the superlattice structure is used. However, the substrate may be any other semiconductor substrate than an InP substrate, such as GaAs and Si. The channel or active layer may be made of a substance made of a compound semiconductor or semiconductors, such as InAs, InP, InSb, GaAs, GaP, and GaSb, or a IV-group semiconductor, such as Si and Ge.

Likewise, the compositionally-graded buffer layer 112 may be composed of more than one type of different semiconductor sublayers providing a lattice constant between the lattice constant value of the substrate and that of the active layer. The sublayers constituting the superlattice structure may have an arbitrary or desired thickness.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:

a semiconductor substrate;

a semiconductor active layer; and a semiconductor compositionally-graded buffer layer formed between said substrate and said active layer, wherein said compositionally-graded buffer layer comprises a semiconductor superlattice structure including a plurality of first semiconductor sublayers and a plurality of second semiconductor sublayers that are alternately stacked in a direction perpendicular to said substrates, wherein each of said first sublayers is made of a first semiconductor material, and each of said second sublayers is made of a second semiconductor material different in composition from said first semiconductor material, and wherein a lattice constant of said first and second sublayers varies stepwise from a side nearest said substrate to said active layer.

2. A semiconductor device as claimed in claim 1, wherein said first semiconductor material is InAlAS and said second semiconductor material is InGaAs.

3. A fabrication method of a semiconductor device comprising the steps of:

forming a semiconductor compositionally-graded buffer layer on a semiconductor substrate; and forming an active layer on said compositionally-graded buffer layer, said step of forming said compositionally-graded buffer layer comprising the step of:

alternately stacking first semiconductor sublayers and second semiconductor sublayers on said substrate in a direction perpendicular to said substrate, thereby forming a semiconductor superlattice structure, wherein each of said first sublayers is made of a first semiconductor material, and each of said second sublayers is made of a second semiconductor material different in composition from said first semiconductor material, and wherein each of said first and second sublayers is formed so that a lattice constant of each of said first and second sublayers varies stepwise from a side nearest said to said active layer.

4. A fabrication method as claimed in claim 3, wherein said first semiconductor material is InAlAs and said second semiconductor material is InGaAs.

5. A semiconductor transistor comprising:

a semiconductor substrate made of a semiconductor material having a first mole fraction;

an active channel region made of a semiconductor material having a second mole fraction; and a graded buffer region between said substrate and said active channel region, said graded buffer region comprising:

a first plurality of semiconductor layers made of a first semiconductor compound material; and a second plurality of semiconductor layers made of a second semiconductor compound material, different from said first semiconductor compound material, said first plurality of semiconductor layers being interleaved with said second plurality of said semiconductor layers to form an alternating stack between said substrate and said channel region, and wherein a material composition of each layer in said stack has a mole fraction graded from that of said first mole fraction in said substrate to that of said second mole fraction in said active channel region.

6. A semiconductor transistor as recited in claim 5 wherein said first semiconductor compound comprises $In_xAl_{1-x}As$ and said second semiconductor compound comprises $In_xGa_{1-x}As$, where x comprises an indicator of the mole fraction.

7. A semiconductor transistor as recited in claim 6 wherein said stack comprises at least fourteen layers wherein pairs of layers in said stack comprise a mole fraction substantially graded as x=0.52, 0.55, 0.60, 0.65, 0.70, 0.75, and 0.80.

* * * * *